(12) United States Patent
Mascolo et al.

(10) Patent No.: US 7,432,120 B2
(45) Date of Patent: Oct. 7, 2008

(54) METHOD FOR REALIZING A HOSTING STRUCTURE OF NANOMETRIC ELEMENTS

(75) Inventors: Danilo Mascolo, Ercolano (IT); Gianfranco Cerofolini, Milan (IT); Gianguido Rizzotto, Civate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 515 days.

(21) Appl. No.: 11/215,297

(22) Filed: Aug. 30, 2005

(65) Prior Publication Data
US 2006/0051946 A1 Mar. 9, 2006

(30) Foreign Application Priority Data
Aug. 31, 2004 (EP) ................................. 04425647

(51) Int. Cl.
*H01L 21/00* (2006.01)
*H01L 21/311* (2006.01)
(52) U.S. Cl. ............................ 438/42; 438/42; 438/694; 438/696; 438/699; 438/703; 438/738; 438/758; 438/759; 438/761; 438/763; 257/E21.205; 257/E21.223; 257/E21.626; 257/E21.64
(58) Field of Classification Search .................. 438/42, 438/44, 694, 696, 697, 699, 703, 738, 758, 438/759, 761, 763, FOR. 385, FOR. 388
See application file for complete search history.

(56) References Cited

U.S. PATENT DOCUMENTS

| | | | | |
|---|---|---|---|---|
| 5,262,336 A | * | 11/1993 | Pike et al. ..................... | 438/138 |
| 5,272,114 A | * | 12/1993 | van Berkum et al. .......... | 438/33 |
| 5,500,869 A | * | 3/1996 | Yoshida et al. ............ | 372/50.23 |
| 5,520,244 A | * | 5/1996 | Mundinger et al. ..... | 165/104.33 |
| 6,365,059 B1 | | 4/2002 | Pechenik ...................... | 216/52 |
| 7,142,772 B2 | * | 11/2006 | Blauvelt et al. ............. | 385/147 |
| 2002/0043690 A1 | | 4/2002 | Doyle et al. ................. | 257/368 |
| 2003/0059983 A1 | | 3/2003 | Ota et al. ..................... | 438/128 |
| 2003/0104700 A1 | * | 6/2003 | Fleming et al. ............. | 438/694 |
| 2004/0146863 A1 | | 7/2004 | Pisharody et al. .............. | 435/6 |
| 2005/0249473 A1 | * | 11/2005 | Page et al. ................... | 385/129 |

(Continued)

FOREIGN PATENT DOCUMENTS

DE 101 23 364 A1 11/2002

(Continued)

*Primary Examiner*—Thanh V Pham
(74) *Attorney, Agent, or Firm*—Lisa K. Jorgenson; Hai Han; Seed IP Law Group PLLC

(57) ABSTRACT

Method for manufacturing a hosting structure of nanometric elements comprising the steps of depositing on an upper surface of a substrate, of a first material, a block-seed having at least one side wall. Depositing on at least one portion of sad surface and on the block-seed a first layer, of predetermined thickness of a second material, and subsequently selectively and anisotropically etching it to form a spacer-seed adjacent to the side wall. The cycle of deposition and selective etching steps of a predetermined material are repeated n times (n≧2), with at least one spacer formed in each cycle. This predetermined material is different for each pair of consecutive depositions. The above n steps provides at least one multilayer body. Further selective etching removes every other spacers to provide a plurality of nanometric hosting seats, which forms contact terminals for a plurality of molecular transistors hosted in said hosting seats.

31 Claims, 6 Drawing Sheets

U.S. PATENT DOCUMENTS

| | | |
|---|---|---|
| 2006/0051919 A1* | 3/2006 | Mascolo et al. ............. 438/253 |
| 2006/0113587 A1* | 6/2006 | Thies et al. ................. 257/328 |
| 2007/0051994 A1* | 3/2007 | Song et al. .................. 257/296 |

FOREIGN PATENT DOCUMENTS

| | | |
|---|---|---|
| DE | 102 47 679 A1 | 4/2004 |
| EP | 0 313 493 A2 | 4/1989 |
| EP | 1 278 234 A2 | 1/2003 |
| WO | WO 99/04440 | 1/1999 |
| WO | WO 02/035580 A2 | 5/2002 |
| WO | WO 02/37571 A1 | 5/2002 |
| WO | WO 03/005369 A2 | 1/2003 |

\* cited by examiner

METHOD FOR REALIZING A HOSTING STRUCTURE OF NANOMETRIC ELEMENTS

BACKGROUND OF THE INVENTION

1. Field of the Invention

The present invention relates, in its more general aspect, to the field of the electronics with nanometric semiconductor electronic devices and to the field of the nano-manufacturing.

More in particular, the invention relates to a method for realizing a hosting structure of nanometric elements realized on a substrate by means of repeating deposition steps of layers of different materials alternating with anisotropic etching steps of these materials.

2. Description of the Related Art

As it is well known, in the field of the microelectronics the need of realizing circuit configurations of more and more reduced dimensions is particularly felt.

In the last thirty years, the progress of the electronic technology has followed a trend governed by that which is known as "Moore Law", an empirical law stating that the capacity of storing information in memory devices doubles each eighteen months approximately, whereas the calculation performance of the CPUs (Central Processing Units) improve of a factor each twenty-four months, as reported in the diagram of FIG. 1.

The Moore law is based on the capacity of reducing the geometries of the considered devices and it highlights how dimensions have passed from being equal to 2 μm for the nineteen eighties technologies, to being equal to 130 nm in 2001, to currently being equal to 90 nm.

However, the current technology is quickly reaching the physical limits of its possibilities; in particular, the currently used photolithography processes are subject to drastic dimensional limitations for values being lower than 100 nm.

Forward techniques have thus been developed, such as x-ray non-optic lithography, extreme ultra-violet lithography and electronic-beam lithography, which allow to realize circuit configurations with dimensions in the order of some tens of nanometers.

These techniques, however, require complex instruments characterized by excessively long times of lithographic etching and they thus tend to be too expensive for being applied to a mass industrial manufacturing.

As an alternative, sub-lithographic patterning techniques have been developed based on controlled (conformable) deposition and of selective removal of a functional material on a suitable layer for realizing nanometric elements.

These techniques have allowed the adjustment of methods for realizing semiconductor substrates suitable for obtaining different typologies of components, as for example indicated in the U.S. Pat. Nos. 6,570,220 and 6,063,688 both to Doyle et. al.

In particular, in these patents a deep submicrometric structure is described for components and, respectively, a method for realizing it. This method provides the realization, on a silicon substrate by means of lithography, first spacers of a first material, whereon, by means of controlled deposition, a layer of a second material is realized. Moreover the thickness of the layer of the second material is approximately half the width of the first spacers.

The selective removal of the second material, carried out by means of anisotropic etching, thus defines second spacers, each being adjacent to respective side portions of the first spacers, and each having width equal to the thickness of the layer of this second material.

With a successive selective chemical etching the first spacers are removed, leaving on the surface of the semiconductor substrate only the second spacers. The deposition of a layer of a third material, controlled in the thickness, followed by a selective removal step by anisotropic etching, defines third spacers.

These third spacers, each adjacent to respective side portions of the second spacers, have a width equal to the thickness of the layer of the third material. With a selective chemical etching the second spacers are removed leaving on the semiconductor surface solely the third spacers.

The operations of controlled depositions, of anisotropic etching and of selective etching are repeated more than once to provide spacers of reduced width of 100 Å or less, which are separated from one another by a distance of around 200 Å. By depositing, finally, a dielectric material in the region defined between two consecutive spacers, a conductive region is realized which can be used for realizing a CMOS transistor.

The above method needs, however, a preliminary and accurate programming since each realization step of an n order (with $n \geq 2$) of spacers is followed by a removal step of the spacers of the previous order (n−1), and it is thus necessary to provide a suitable distance and a suitable thickness of the first spacers for realising last spacers of desired dimensions.

In the U.S. Pat. No. 6,187,694 to Cheng et al. a method is also described for realizing a structure of an integrated circuit, for example a gate electrode of a MOS transistor, by using two edge definition layers and a spacer realized above a substrate. The gate electrode is realized, on the substrate portion below the spacer, by means of a succession of chemical etchings, each suitable for selectively removing portions of edge definition layers and substrate portions. These selective etchings are preceded by depositions of materials by means of masking.

Finally, in U.S. Pat. No. 6,664,173 to Doyle et al., a technique is described for patterning a hardmask gate, for all the typologies of components, by using a gate spacer for approaching nanometric masks. This technique provides starting from a unit comprising a substrate whereon first gate and respectively hardmask layers and subsequent second gate and hardmask layers are deposited.

On the second hardmask layer, by means of deposition followed by etching steps, a nanometric spacer is defined and used as a mask for realizing a gate electrode for a first transistor.

From the first hardmask layer of the same unit a structure is realized for a second transistor after further deposition and etching steps.

Subsequent steps are however required for realizing a MOS device.

Although satisfying the aim, this method is limited in that it allows to realize, although of nanometric dimensions, a single gate electrode for a transistor.

In substance, all the known methods are inadequate to fulfill the need of realizing nanometric structures with suitable conduction and control terminals for use as semiconductor electronic devices.

BRIEF SUMMARY OF THE INVENTION

One embodiment of the present invention provides a method for realizing a hosting structure of nanometric elements overcoming the dimensional limits of the semiconductor electronic devices realized according to the methods provided by the prior art.

Another embodiment of the present invention provides a structure suitable for realizing conduction terminals for at least one nanometric component realized by means of a molecular component, i.e., by means of a functionalized molecule capable of performing specific actions. The structure comprising: a substrate, a plurality of spacers of conductive material, each being arranged on top of and perpendicular to the substrate, any adjacent two conductive spacers defining a hosting seat, each hosting seat being less than 30 nm in width; and a plurality of nanometric elements, each being accommodated in a hosting seat.

Another embodiment of the present invention provides a method for realizing a nanometric structure capable of hosting the above molecular components and capable of realizing the conduction terminals for these components, the method comprising:

depositing on an upper surface of an insulating substrate of a first material, a block-seed having a side wall perpendicular to said upper surface;

depositing on a portion of said surface and of said block-seed a first layer of first thickness of a second material;

anisotropically etching said first layer to provide a spacer-seed adjacent to at least one portion of said sidewall of said block-seed;

repeating n times, with $n \geq 2$, a step comprising a deposition on at least one portion of said substrate of a layer of a predetermined thickness of a predetermined material followed by an anisotropic etching of said layer with realization of at least one relative spacer, said predetermined material being different for each pair of consecutive depositions, said n steps defining at least one multilayer body comprising n spacers made of at least two different materials and said at least one spacer-seed; and selectively etching said multilayer body to remove a fraction of said spacers to form at least one plurality of nanometric hosting seats such that said structure is suitable for hosting in said at least one plurality of hosting seats a plurality of nanometric elements, a remaining fraction of said spacers realizing contact terminanls for said elements.

Another embodiment of the invention provides a nanometric electronic device as defined by the method above.

In substance, according to the invention a method is devised for realizing a structure capable of hosting the above molecular components realizing semiconductor electronic devices of the hybrid type.

The characteristics and advantages of the method according to the invention will be apparent from the following description of an embodiment thereof given by way of indicative and non limiting example making reference to the annexed drawings.

Figure 12:
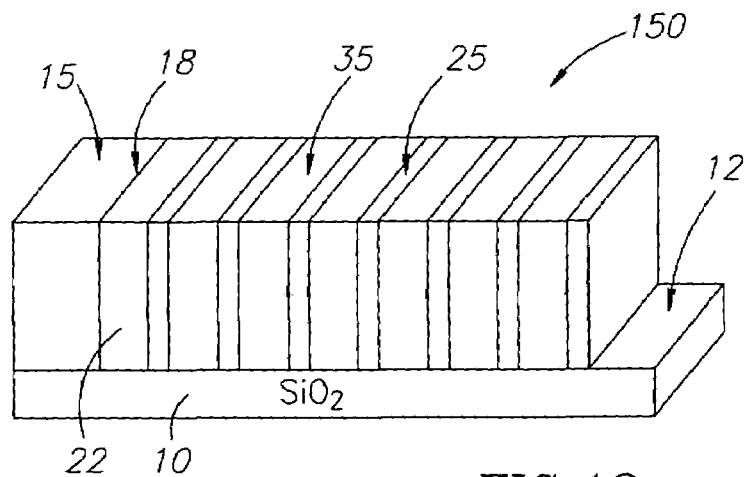
Figure 13:
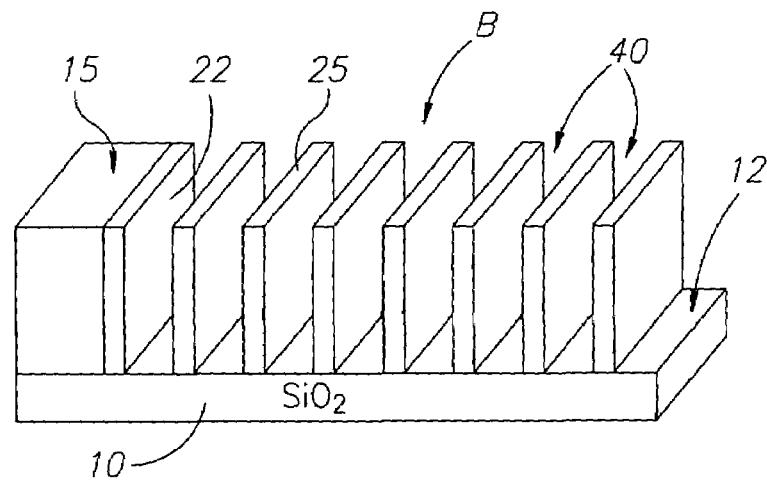
Figure 14:
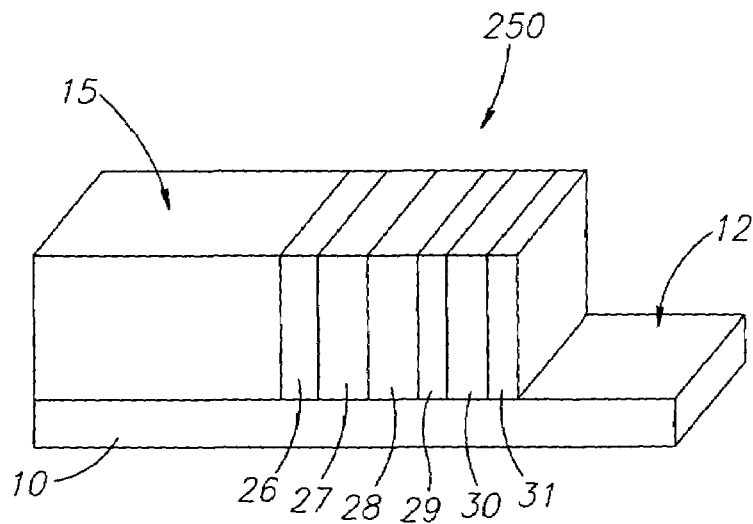

FIGS. from 2 to 11 show in sequence the steps of the method according to the invention for realizing a nanometric structure;

FIGS. 12 and 13 show a further embodiment of a nanometric structure realized according to the method according to the invention;

FIG. 14 shows a further embodiment of a nanometric structure according to the invention in an intermediate step of the method.

Figure 15:
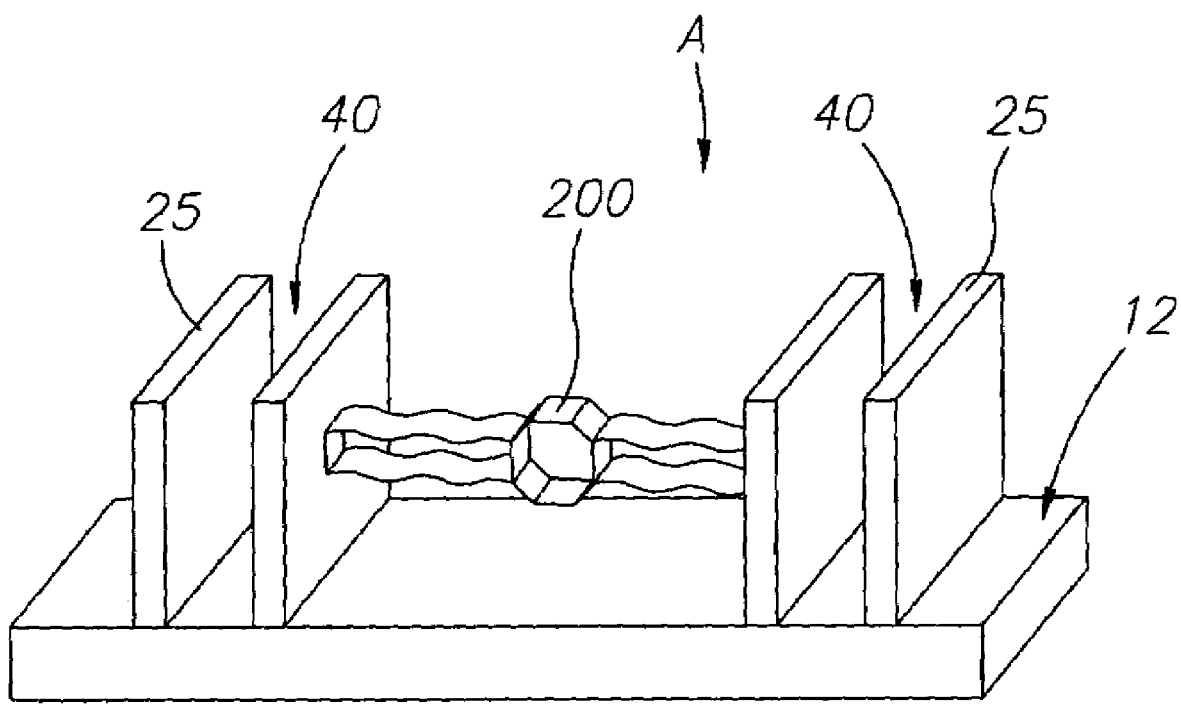

FIG. 15 shows an embodiment of a nanometric device comprsing a molecular component within a hosting seat.

DETAILED DESCRIPTION OF THE INVENTION

The hereafter described steps are not a complete flow of a method for realizing a hosting structure for a plurality of nanometric electronic components and hereafter only the steps necessary to a skilled technician of the field for the comprehension of the invention are described. The present invention can be put in practice by using the usual techniques employed in the manufacturing of the semiconductor electronic devices.

Moreover, the figures showing schematic views of portions of an integrated circuit during the manufacturing are not drawn to scale but they are instead drawn so as to underline the important characteristics of the invention.

The present invention starts from the idea of realizing an electronic device comprising a plurality of molecular components as nanometric elements as well as a single hosting structure capable of hosting this plurality of molecular components and of realizing the conduction and control terminals.

Figure 11:
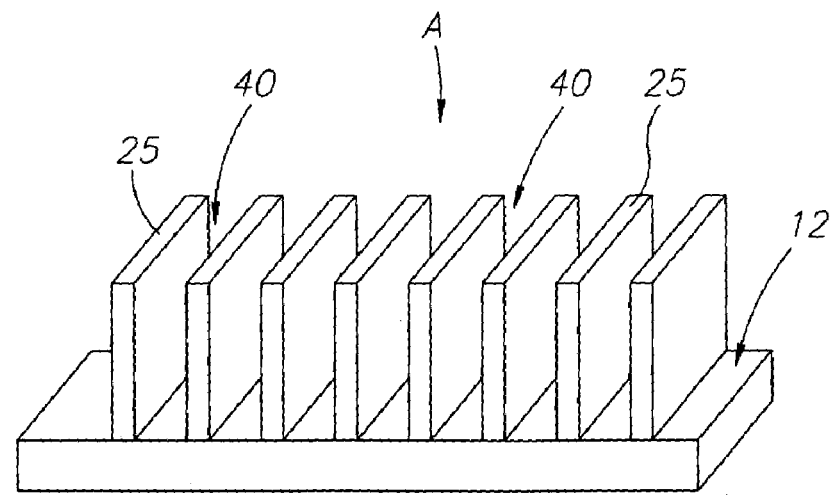

Such a hosting structure A is shown in FIG. 11.

In particular, the hosting structure A, realized on a substrate 10, comprises a plurality of bar-like elements commonly indicated as spacers 25, and made of conductive material. These spacers are parallel, equidistant from each other, and perpendicular to an upper surface 12 of the substrate 10.

The thus defined hosting structure A, realizes a plurality of hosting seats 40 for nanometric elements, in particular molecular components (not shown in the figures), the above spacers 25 defining respective conduction terminals for these molecular components.

Figure 10:
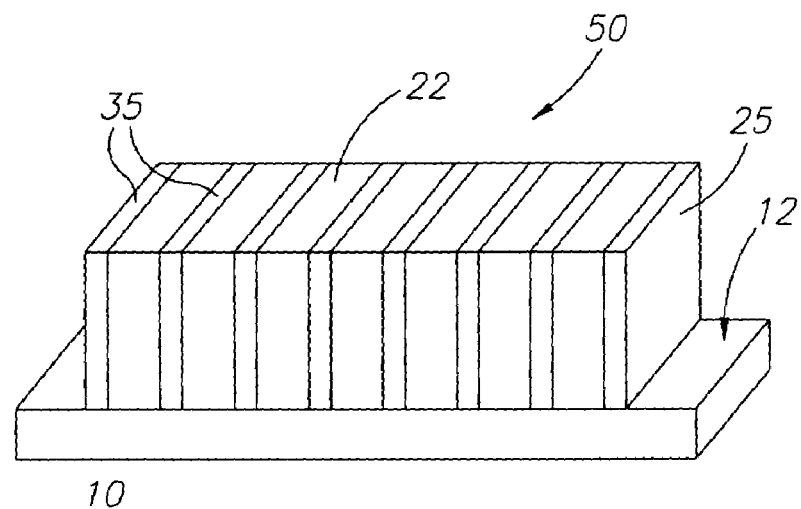

The hosting structure A is realized by means of an etching step of a multilayer body 50 as that shown in FIG. 10.

In particular, the multilayer body 50 is formed on top of the substrate 10, the substrate being made of a first material, for example, silicon dioxide. The multilayer body 50 comprises a plurality (n) of alternating spacers 25, 35, made of at least two different materials, which are conductive and insulating materials respectively. This multilayer body 50 is realized in accordance with the method according to the invention as shown in the FIGS. from 2 to 10.

Figure 2:
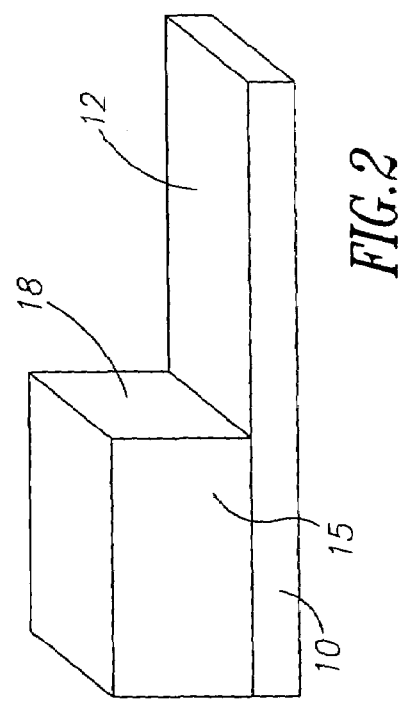

In particular, in the method according to the invention, a block-seed 15 realized by means of a conventional photolithographic deposition step, is first deposited, as shown in FIG. 2, on a peripheral portion of the surface 12.

This deposition step is suitably followed by a conventional chemical etching step, by using, for example, a solution of $CHF_3/O_2$. The step allows for the etching of the block-seed 15 realizing thereon at least one side wall 18 arranged perpendicularly to the surface 12.

Figure 1:
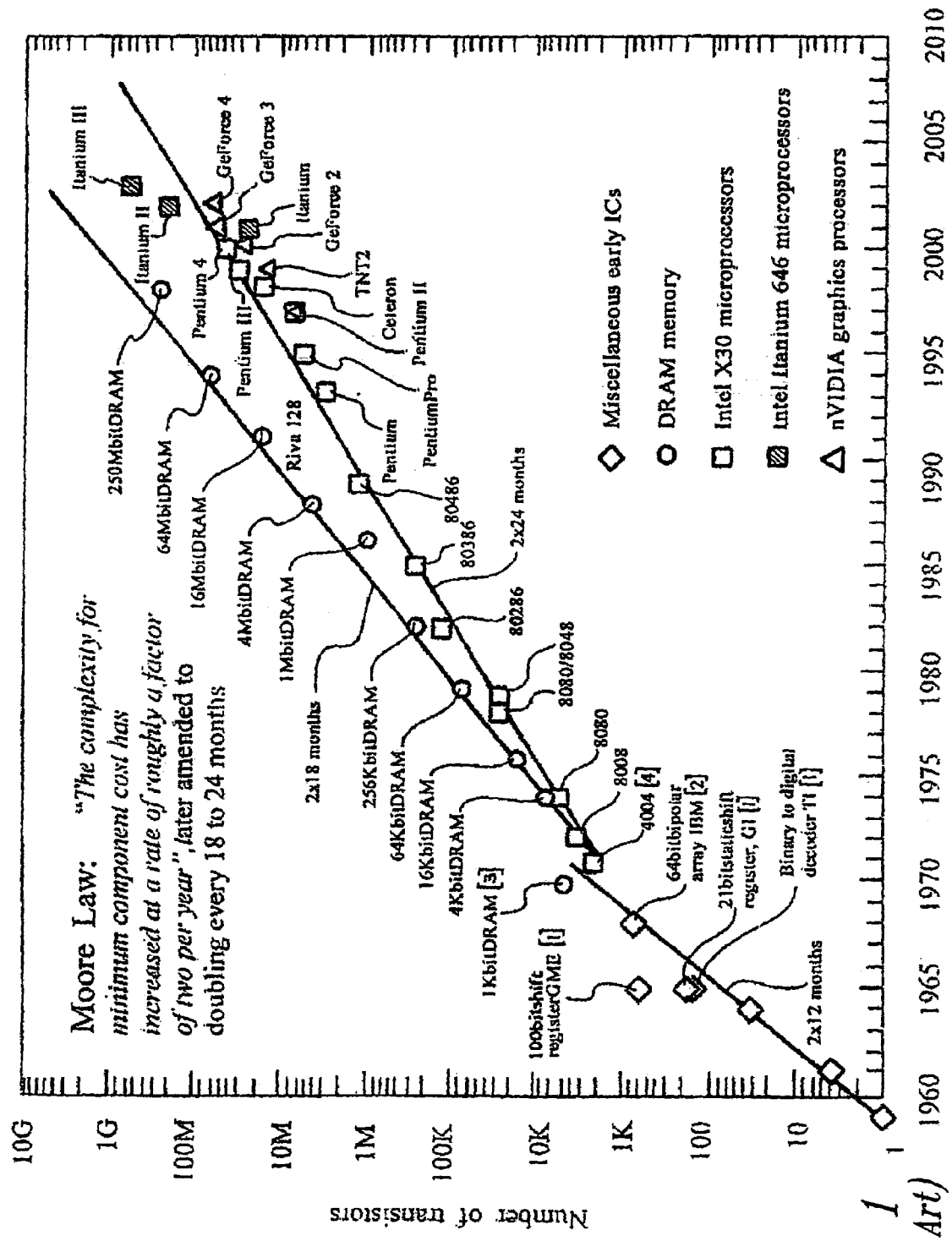
FIG. 1 is a diagram reporting the Moore Law.
Figure 3:
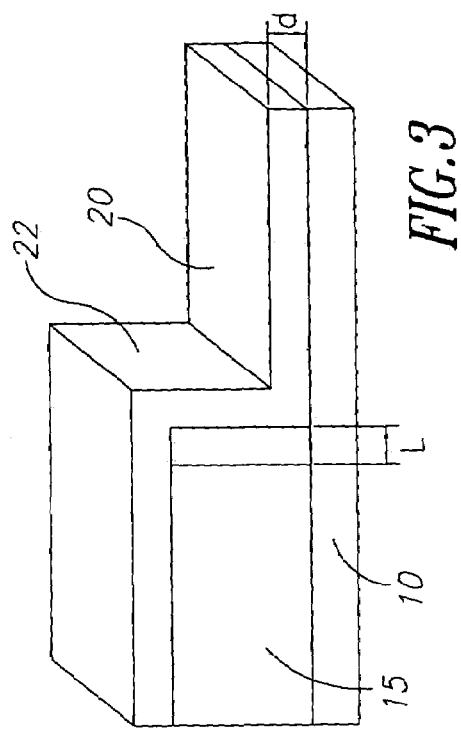

The method next provides a deposition step on the surface 12 and on top of the block-seed 15, of a first layer 20 of first thickness of a second material. In particular, with reference to the example of FIG. 3, the first layer 20 is defined by a thin film of conductive material, such as polysilicon, deposited with a predetermined and uniform thickness indicated with "d".

Preferably, the thickness "d" has nanometric dimensions and scalability thereof up to 5 nm has been demonstrated. In general, nanometric dimensions refer to layers with thickness lower than 30 nm and most preferably below 10 nm.

This first layer 20, deposited according to conventional techniques, is conformably adapted to the underlying topography, i.e., in particular, it has a portion 22 adjacent to the side wall 18 of the block-seed 15. The portion 22 has a width "L" equal to the above thickness "d" of the first layer 20.

Figure 4:
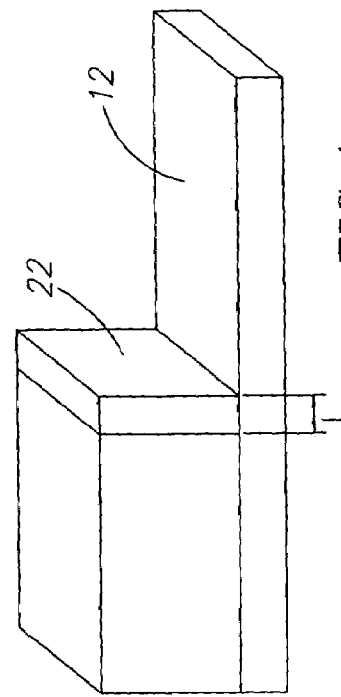

Subsequently, according to conventional techniques, an anisotropic etching step is carried out to remove the first layer 20 except for the above portion 22 adjacent to the side wall 18, as highlighted in FIG. 4.

In particular, the etching of the first layer 20 is performed anisotropically along the direction parallel to the surface 12 of the substrate 10 by means of sputtering.

The residual portion 22 of the first layer 20, indicated also as spacer-seed, is arranged perpendicularly to the surface 12 of the substrate 10.

Figure 5:
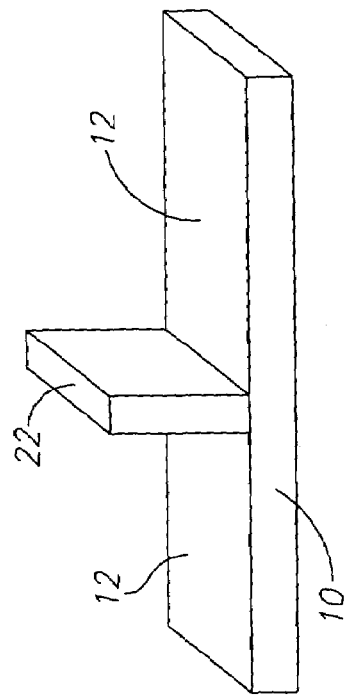

With particular reference to FIG. 5, the spacer-seed 22 is shown after a removal step of the block-seed 15, however, in the method according to the invention, this removal step can also be provided after the realization of the whole multilayer body 50.

In particular, the removal step of the block-seed 15 is carried out by means of selective chemical etching (for example, $H_3PO_4$ for block seed made of nitride).

Obviously, the spacer-seed 22 is an integral part of the multilayer body 50, as better highlighted in FIG. 10.

According to the invention, the deposition and etching steps described above can be repeated n times (n≧2), with each iteration comprising a deposition, on at least one portion of the substrate 10, of a layer of predetermined thickness of a predetermined material followed by an anisotropic etching of the same layer with the realization of at least a relative spacer analogous to the spacer-seed 22, perpendicular to the upper surface 12 of the substrate 10.

Figure 6:
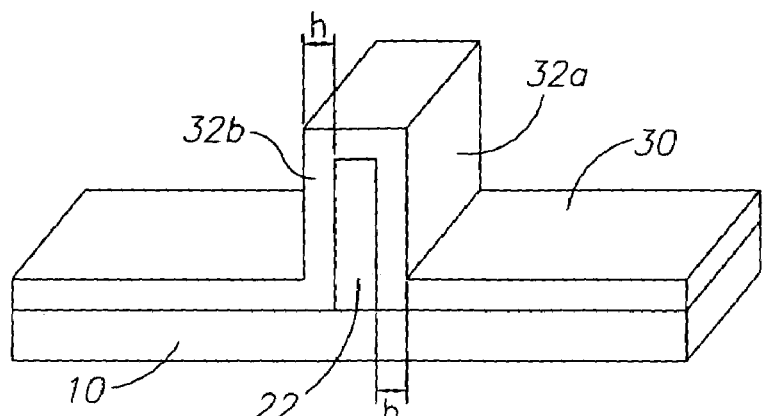

More in particular, as better highlighted in FIG. 6, the method thus provides a deposition of a second layer 30 of a third material, for example silicon nitride or other insulating material such as an oxide, with a predetermined and uniform thickness indicated with "e".

Preferably, the thickness "e" is nanometric and it is determined by the dimension of the molecule to be hosted, controlled up to 1 nm.

Obviously, in the case where the third material is an oxide, any suitable deposition method to form the second layer 30 can be employed. Such methods include both by means of effective deposition of the oxide, for example by means of "CVD-oxide" (control vapor deposition oxide), and by means of growth of the oxide itself from the underlying layer, for example by means of "Thermal Oxidation" technique.

This second layer 30 is conformably deposited on the surface 12 and on the spacer-seed 22, so that it is to be adapted to the underlying topography similarly to what has been described above for the deposition of the first layer 30.

In particular, as highlighted in FIG. 6, the second layer 30 has a first portion 32a and a second portion 32b adjacent to opposed side walls of the spacer-seed 22 and having a width "h" equal to the above thickness "e" of the second layer 30.

Figure 7:
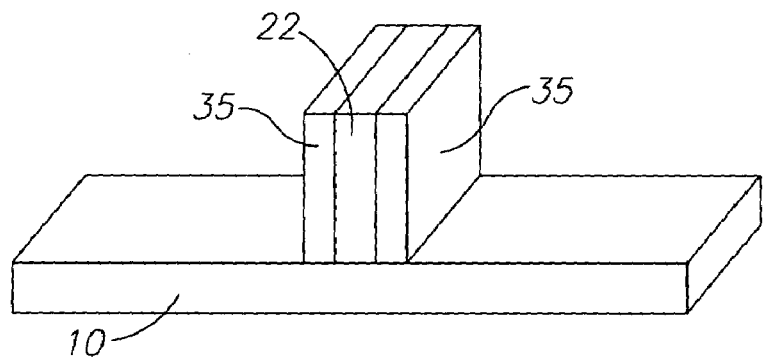

Through an anisotropic etching the third material is removed except for the first and the second portion 32a, 32b of the second layer 30, which define respective spacers 35, as better highlighted in FIG. 7.

Figure 8:
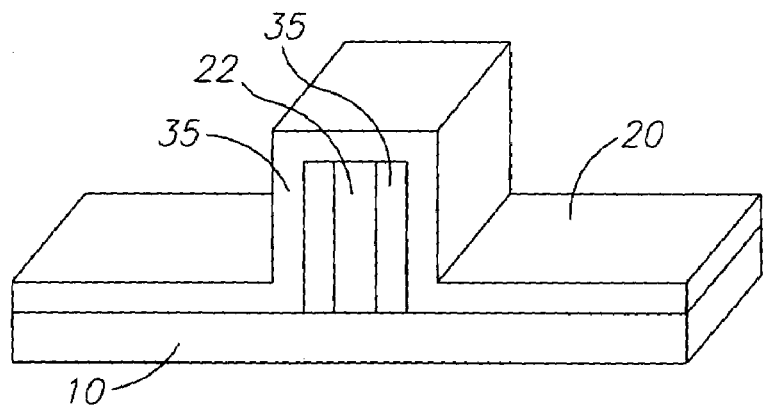
Figure 9:
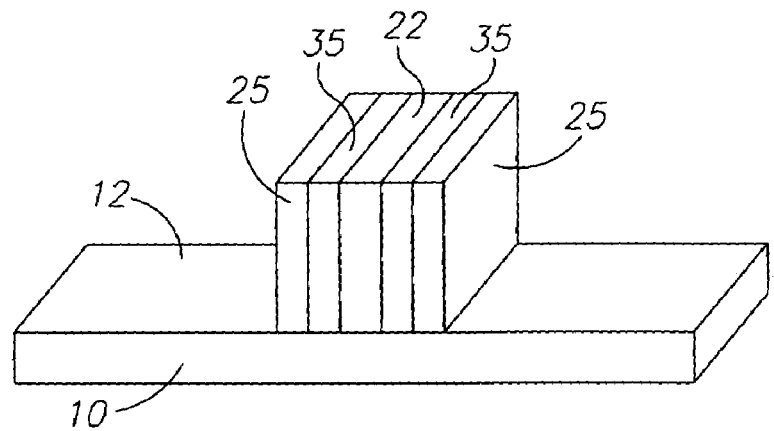

The method thus provides another step comprising a further deposition of another layer of the second material, similar to the first layer 20, deposited with a predetermined and uniform thickness on the surface 12, on the spacer-seed 22 and on the spacer 35, as highlighted in FIG. 8. Said step thus comprises an anisotropic etching of said layer to define spacer 25, as better highlighted in FIG. 9.

Essentially, first and second layers 20, 30, are alternately deposited by repeating n times the above described step comprising a deposition of a layer followed by an anisotropic etching of portions of the same layer.

As a result of the above n steps, the multilayer body 50 is formed comprising a plurality of spacers 25 alternating with a plurality of spacers 35 and the spacer-seed 22, as shown in FIG. 10.

A removal step of the plurality of spacers 35, through a conventional plasma etching selective with respect to the third material which realizes the second layers 30, provides the nanometric hosting structure A comprising a plurality of spacers 25 of the second material. These spacers are suitable for defining a plurality of hosting seats 40 for molecular components, each hosting seat 40 being defined by the gap between a spacer 25 and an adjacent one, as highlighted in the example of FIG. 11.

Moreover, as highlighted in the example of FIG. 11, the widths of such spacers 25 are all equal to each other. It is, however, possible to realize spacers 25 having non-uniform dimensions by depositing first layers 20 of different thickness.

Advantageously, the widths of the spacers 35 can be provided with predetermined values, also different from one another, depending on the final use of the hosting structure A and the dimensions of the molecular components intended for being hosted therein.

In the example shown, the multilayer body 50 develops in opposite directions with respect to the spacer-seed 22, the block-seed having been removed. It would be also possible to realize a multilayer body 50 which develops from the spacer-seed 22 in a single direction with respect to the block-seed 15 if it has not been previously removed.

With reference to FIG. 12, a multilayer body 150 is shown being realized by means of a further embodiment of the method according to the invention. In this embodiment the details identical to the preceding example will be indicated with the same reference numbers.

As above described in connection with FIGS. 1-11, by means of a photolithographic deposition step on a substrate 10 made of a first material, for example silicon oxide, a block-seed 15 is realized.

This block-seed 15 is for example realized with a specific material, such as silicon nitride. It is also possible to realize such block-seed 15 by depositing a plurality of stacked layers of different materials.

By means of a chemical etching step on the block-seed 15 a side wall 18 is defined as being perpendicular to a surface 12 of the substrate 10.

The method next provides a step comprising a deposition on the surface 12 and on the block-seed 15 of a first layer of a second material followed by an anisotropic etching of this first layer so as to realize a spacer-seed 22 adjacent to the side wall 18.

In particular, in this embodiment of the method according to the invention, the block-seed 15 is not removed until the end of the realization of the whole multilayer body 150.

A step comprising a deposition on the surface 12, on the block-seed 15 and on the spacer-seed 22 of a second layer of a third material followed by an anisotropic etching of such second layer defines a single spacer 35 adjacent to the spacer-seed 22.

The above first and second layer are respectively of conductive material (e.g., polysilicon) and of insulating material (e.g., silicon oxide).

According to the invention, the deposition and etching steps described above can be repeated n times (n≧2), with each iteration comprising a deposition, on at least one portion of the substrate 10, of a layer of predetermined thickness of a predetermined material followed by an anisotropic etching of the same layer with realization of at least a pair of spacers 25 and 35.

In this embodiment, the predetermined material is differently chosen for each pair of consecutive depositions, the n steps defining at least one multilayer body 150 comprising a plurality of spacers 25, 35 of at least two different materials and said at least one spacer-seed 22.

A removal step of the plurality of the second spacers 35 through a selective plasma etching towards the silicon oxide provides a nanometric hosting structure B, as shown in the example of FIG. 13.

The hosting structure B comprises a plurality of spacers 25 of the second material. These spacers are suitable for defining a plurality of hosting seats 40 for molecular components, each hosting seat 40 being defined by the gap between a spacer 25 and an adjacent one.

In substance, the spacers 25 of the hosting structure A or B, define conduction terminals for the nanometric molecular components (not shown) hosted in the structure.

In the example shown in FIGS. 12-13, the multilayer body 150 develops from the spacer-seed 22 in a single direction with respect to the block-seed 15. It would also be possible to realize a multilayer body 150 developing in opposite directions with respect to the spacer-seed 22, by attending to the removal of the block-seed immediately after the formation of the spacer seed 22.

Obviously, a second multilayer body can be realized on the same substrate 10 adjacent to a side wall opposite to the side wall 18 of the same seed-block 15.

This second multilayer body realized by means of the same method as described above is not shown in the annexed figures.

Advantageously, the above steps comprising the deposition of first and second layers can be provided by using different materials deposited with different thickness, realizing a multilayer body 250 comprising a plurality of different spacers as indicated in the example of FIG. 14 where the spacers 26-31 can be made of different materials and/or have different thickness.

One or more removals through one or more plasma etchings, selective towards the respective materials of the spacers, provides a nanometric hosting structure with conduction terminals defined by spacers different from one another in thickness and material.

It is thus possible to realize a nanometric electronic device by providing a nanometric hosting structure as previously described and to host therein a plurality of nanometric elements, in particular molecular components 200, as shown in FIG. 15. The nanometric hosting structure has respective conduction terminals realized by the spacers of the hosting structure.

In particular, it is possible to predispose the hosting structure for hosting molecular components as described in the U.S. Pat. No. 6,724,009, in the name of STMicroelectronics, S.r.l., the assignee of the present application, which patent is incorporated herein by reference in its entirety. By using the method described in such application, the molecular components in the hosting seats of the structure automatically bond to the conductive spacers which form the conduction terminals.

In one embodiment, the realization of the hosting structure is completed prior to the hosting of the molecular components and to the subsequent realization of the desired hybrid semiconductor device. In this way, the molecular components do not undergo any stress linked to the process steps for realizing the hosting structure.

A main advantage of the method according to the present invention is therefore represented by the fact of realizing a nanometric hosting structure suitable for hosting and realizing nanometric control terminals of nanometric elements, in particular molecular components.

In particular, the method according to the invention allows to realize a plurality of nanometric conduction terminals suitable for addressing the above molecular components for orienting the functionalized molecules, which can be controlled to perform specific actions.

A further advantage of the present method is that of realizing a hosting structure of the above described type, wherein the plurality of hosting seats and the conduction terminals can be realized with different dimensions, in particular scaling down to the nanometer dimensions. Such structure allows for hosting molecular components of different nature and dimensions. In addition, such structure enables testing and individually questioning single terminals.

A further advantage is in its easiness and speed, since steps are provided which can be easily integrated in the productive process currently in use for obtaining semiconductor devices.

In substance, thanks to the present invention, it is possible to realize a nanometric structure, wherein suitably functionalized molecules are hosted in the seats defined between two adjacent spacers suitable for realizing contacts and control terminals for such molecules. These molecules are suitably addressed in correspondence with such terminals thus realizing a semiconductor device of the hybrid type comprising a plurality of nanometric elements, in particular molecular components.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for realizing a hosting structure of nanometric elements comprising:

depositing on an upper surface of an insulating substrate of a first material, a block-seed having a side wall perpendicular to said upper surface;

depositing on a portion of said surface and of said block-seed a first layer of first thickness of a second material;

anisotropically etching said first layer to provide a spacer-seed adjacent to at least one portion of said side wall of said block-seed;

repeating n times, with n≧2, a step comprising a deposition on at least one portion of said substrate of a layer of a thickness of a material followed by an anisotropic etching of said layer with realization of at least one relative spacer, said deposited material being different for each pair of consecutive depositions, said n steps defining at least one multilayer body comprising n spacers made of at least two different materials and said at least one spacer-seed; and selectively etching said multilayer body to remove a fraction of said spacers for realizing at least one plurality of nanometric hosting seats such that said structure is suitable for hosting in said at least one plurality of hosting seats a plurality of nanometric elements, a remaining fraction of said spacers realizing contact terminals for said elements.

2. The method according to claim 1, further comprising: anisotropically etching said block seed.

3. The method according to claim 1, further comprising an anisotropic etching step of said block seed subsequent to the realization of said spacer-seed.

4. The method according to claim 1, wherein, in each pair of said consecutive depositions, said at least two different materials are a conductive material and an insulating material, thereby forming subsequently of said selective and anisotropic etchings, said spacers of respectively conductive and insulating materials.

5. The method according to claim 4, wherein said depositions of conductive material deposit layers of equal thickness to each other, with realization of conductive spacers having equal width to each other.

6. The method according to claim 4, wherein said depositions of insulating material deposit layers of equal thickness to each other, with realization of said insulating spacers having equal width to each other.

7. The method according to claim 4, wherein said depositions of conductive material deposit layers of different thickness to each other, with realization of said conductive spacers having different width to each other.

8. The method according to claim 4, wherein said depositions of insulating material deposit layers of different thickness to each other, with realization of said insulating spacers having different width to each other.

9. The method according to claim 1, wherein said depositions deposit said layers with thickness under 30 nm.

10. The method according to claim 9 wherein said deposition steps deposit layers having thickness between 1 nm and 5 nm.

11. The method according to claim 1, wherein said nanometric elements comprise molecular components realized by functionalized molecules.

12. An nanometric electronic device comprising:
a nanometric element hosted in a hosting structure realized by;
depositing on an upper surface of an insulating substrate of a first material, a block-seed having a side wall perpendicular to said upper surface;
depositing on a portion of said surface and of said block-seed a first layer of first thickness of a second material;
anisotropically etching said first layer to provide a spacer-seed adjacent to at least one portion of said side wall of said block-seed;
repeating n times, with $n \geq 2$, a step comprising a deposition on at least one portion of said substrate of a layer of a thickness of a material followed by an anisotropic etching of said layer with realization of at least one relative spacer, said deposited material being different for each pair of consecutive depositions, said n steps defining at least one multilayer body comprising n spacers made of at least two different materials and said at least one spacer-seed; and
selectively etching said multilayer body to remove a fraction of said spacers for realizing at least one plurality of nanometric hosting seats such thatsaid structure is suitable for hosting in said at least one plurality of hosting seats a plurality of nanometric elements, a remaining fraction of said spacers realizing contact terminals for said elements, said spacers of said hosting structure defining respective conduction and addressing terminals of said nanometric element.

13. A method of manufacturing a nanometric semiconductor device comprising:
(a) providing a substrate of an insulating material;
(b) depositing on an upper surface of the substrate, a block seed of a first material, said block seed having a side wall substantially perpendicular to said upper surface;
(c) depositing conformably on a portion of said upper surface and said block-seed a first layer of a second material in a first thickness, whereby a width of a portion of the first layer adjoining the side wall of the block seed is substantially the same as the first thickness;
(d) anisotropically etching said first layer to provide first spacer which is the portion of the first layer adjoining the side wall of said block seed;
(e) depositing conformably on a portion of said upper surface, said block-seed and said first spacer a second layer of a third material in a second thickness, whereby a width of a portion of the second layer adjoining a side wall of the first spacer is substantially the same as the second thickness;
(f) anisotropically etching said second layer to provide second spacer which is the portion of the second layer adjoining the side wall of said first spacer;
(g) repeating steps (e)-(f) to provide a multilayer body comprising a plurality of alternating first and second spacers.

14. The method of claim 13 further comprising a step of removing said block seed.

15. The method of claim 14 wherein the step of removing said block seed is carried out after step (g).

16. The method of claim 14 wherein the step of removing said block seed is carried out following step (d) whereby the depositing step following the removal step provides portions of the second layer adjoining opposite walls of the first spacer.

17. The method of claim 13 further comprising selectively etching the multilayer body to remove second spacers, whereby the plurality of first spacers remain and a plurality of hosting seats defined by every two adjacent first spacers are provided.

18. The method of claim 17 wherein the plurality of hosting seats are conductive terminals.

19. The method of claim 18 wherein a plurality of nanometric elements are incorporated in between each two adjacent conductive terminals.

20. The method of claim 19 wherein the nanometric elements are functionalized molecules.

21. The method of claim 13 wherein the second material is a conductive material and the third material is an insulating material.

22. The method of claim 13 wherein the first thickness and the second thickness are substantially the same.

23. The method of claim 13 wherein each first thickness in the repeating steps are the same or different from one another.

24. The method of claim 13 wherein each second thickness in the repeating steps are the same or different from one another.

25. The method of claim 13 where each of the first spacers is less than 30 nm in width.

26. The method of claim 22, wherein each of the first spacers is about between 1 nm and 5 nm in thickness.

27. The method of claim 17 wherein each of the hosting seat is less than 30 nm in width.

28. The method of claim 27 wherein each of the hosting seat is less about between 1 nm and 5 nm in width.

29. The nanometric electronic device of claim 12 wherein each hosting is less than 30 nm in width.

30. The nanometric device of claim 29 wherein each hosting seat is about between 1 and 5 nm in width.

31. The nanometric device of claim 12 wherein the nanometric elements are functionalized molecules.

* * * * *

UNITED STATES PATENT AND TRADEMARK OFFICE
CERTIFICATE OF CORRECTION

PATENT NO. : 7,432,120 B2
APPLICATION NO. : 11/215297
DATED : October 7, 2008
INVENTOR(S) : Danilo Mascolo et al.

It is certified that error appears in the above-identified patent and that said Letters Patent is hereby corrected as shown below:

Title Page
Section (57), lines 4-5, "Depositing on at least one portion of sad surface and on the block-seed a first layer," should read as -- Depositing on at least one portion of said surface and on the block-seed a first layer, --

Column 8
Line 38, "depositing on a portion of said surface and" should read as -- depositing on a portion of said upper surface and --

Column 9
Line 21, "depositions deposit said layers with thickness under 30 nm" should read as -- depositions deposit layers with thickness under 30 nm --

Column 9
Lines 29-30, "a nanometric element hosted in a hosting structure realized by;" should read as -- a nanometric element hosted in a hosting structure realized by: --

Column 9
Line 34, "depositing on a portion of said surface and" should read as -- depositing on a portion of said upper surface --

Column 9
Line 50, "nanometric hosting seats such thatsaid structure is suitable" should read as -- nanometric hosting seats such that said structure is suitable --

Column 10
Lines 4-5, "anisotropically etching said first layer to provide first spacer" should read as -- anisotropically etching said first layer to provide a first spacer --

Column 10
Line 29, "whereby the plurality of first spacers remain and a plurality of" should read as -- whereby a plurality of first spacers remain and a plurality of --

Column 10
Line 49, "where each of the first spacers" should read as -- wherein each of a plurality of first spacers --

UNITED STATES PATENT AND TRADEMARK OFFICE
CERTIFICATE OF CORRECTION

PATENT NO. : 7,432,120 B2
APPLICATION NO. : 11/215297
DATED : October 7, 2008
INVENTOR(S) : Danilo Mascolo et al.

It is certified that error appears in the above-identified patent and that said Letters Patent is hereby corrected as shown below:

Column 10
Lines 51-52, "wherein each of the first spacers" should read as -- wherein each of a plurality of first spacers --

Column 10
Line 58, "wherein each hosting is less than 30 nm in width" should read as -- wherein each hosting seat is less than 30 nm in width --

Signed and Sealed this

Twenty-first Day of April, 2009

JOHN DOLL
*Acting Director of the United States Patent and Trademark Office*

UNITED STATES PATENT AND TRADEMARK OFFICE
CERTIFICATE OF CORRECTION

| | |
|---|---|
| PATENT NO. | : 7,432,120 B2 |
| APPLICATION NO. | : 11/215297 |
| DATED | : October 7, 2008 |
| INVENTOR(S) | : Danilo Mascolo et al. |

It is certified that error appears in the above-identified patent and that said Letters Patent is hereby corrected as shown below:

<u>Column 10</u>
Lines 13-14, "anisotropically etching said second layer to provide second spacer" should read as -- anisotropically etching said second layer to provide a second spacer --

Signed and Sealed this

Eighth Day of September, 2009

David J. Kappos
*Director of the United States Patent and Trademark Office*